SILICON-BASE SEMICONDUCTOR DEVICES AND METHOD OF MANUFACTURE THEREOF

Filed July 19, 1955

United States Patent Office 2,831,787

Patented Apr. 22, 1958

2,831,787

SILICON-BASE SEMICONDUCTOR DEVICES AND METHOD OF MANUFACTURE THEREOF

Reimer Emeis, Pretzfeld, Germany, assignor to Siemens-Schucktwerke Aktiengesellschaft, Berlin-Siemensstadt and Erlangen, Germany, a corporation of Germany Application July 19, 1955, Serial No. 523,060

Claims priority, application Germany July 27, 1954

19 Claims. (Cl. 148—1.5)

Figure 1:
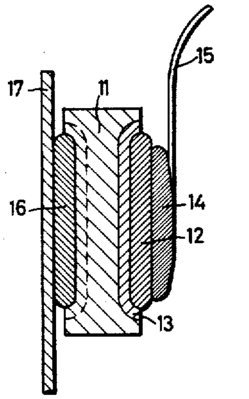

My invention relates to rectifiers, transistors, thermistors, Hall-voltage generators and similar electric devices comprising a body of semiconducting material, and more particularly to semiconductor devices on the basis of silicon wherein the semiconducting body is formed essentially of silicon or a silicon compound or a mixture containing silicon as an essential constituent.

For the production of such devices the semiconductor body is contacted with terminals or electrodes of good conducting metal which form the points of circuit connection for the semiconductor. Some of these metal-semiconductor contacts are barrier-free; that is they are of substantially symmetrical conductance to conduct current in both directions. Other contacts are required to secure a barrier effect by forming adjacent to the contact material a layer of a conductance type opposed to that of the bulk of the semiconductor body, thus giving cause to a p-n junction which prevents or greatly impedes the flow of current in one of the two directions.

For instance when p-conductive germanium is provided with a contact of antimony, then an n-conductive germanium layer is produced within the germanium body in the vicinity of the antimony contact. Between this layer and the p-conductive bulk of the germanium body, there is a p-n junction of asymmetrical conductance. However when p-conductive germanium is contacted for instance with aluminum, then the contact is barrier-free and it has virtually the same conductivity for electric currents in both directions.

In contrast to semiconductor bodies of germanium, the contacting of such substances as silicon, silicon carbide and similar silicon-containing substances, has been extremely troublesome. This is so because, for instance, elementary silicon forms alloys with only few other substances, and because the thermal expansion of the majority of any silicon alloys formed with these few substances is greatly different from that of silicon itself. For instance, when an attempt is made to alloy a layer of antimony of appreciable thickness onto a body of silicon, undesired mechanical tensions are produced in the material by thermal effects. Due to the brittleness of silicon, such effects cause fissures or cracks so that the contact layer will eventually break off the silicon body when the contacted body is permitted to cool. A similar behaviour is observed with silicon carbide as well as with other silicon-containing semiconductor substances such as a composition containing silicon and germanium in amounts within the same order of magnitude. Even a thin layer of antimony, though too inconvenient for attaching electric leads thereto, is difficult to join with a silicon-base semiconductor because such thin antimony layers evaporate too readily off the semiconductor body.

It is an object of my invention to obviate the above-mentioned difficulties occurring particularly with silicon-base semiconductor devices, and to provide a silicon-type semiconductor device that can be readily manufactured and affords a reliability of operation and permanence comparable to those of germanium-type devices.

According to my invention, the body of silicon, silicon carbide or similar semiconductor substance is joined and alloyed with germanium doped for p- or n-conductance, and the contact metal proper is joined with the resulting layer. In such a device there exists, between the fundamental semiconductor body and the contact metal proper, an intermediate layer formed of an alloy of germanium with the substance of the semiconductor body, and this germanium alloy is doped by an addition substance of the same conductance type as the contact metal.

According to another feature of my invention, the intermediate contacting layer of germanium alloy is doped for the type of conductance opposed to that of the fundamental body. The contacting layer then imparts to the adjacent zone of the fundamental body, by diffusion of lattice defection atoms, the same conductance type as that of the doped germanium. As a result, a p-n junction is produced in the fundamental semiconductor body.

By virtue of the invention, the above-mentioned difficulties of joining contacts with semiconductor bodies of silicon or similar substances are obviated. For instance, the invention makes it possible to provide a p-conductive silicon body with a layer of germanium-containing alloy of the n-conductive type, or to provide an n-conductive silicon body with a p-conductive layer of germanium alloy. Such layers can be applied on one or more places of the semiconductor body and no difficulty is encountered in soldering terminal pieces or wires to the alloyed places.

The favorable results obtained by the invention are due to the fact that the difficulties of properly doping and contacting encountered with silicon occur to a very much lesser extent with germanium, and that on the other hand germanium and silicon have the same lattice structure and have only slightly different lattice constants thus tending to form mixed crystals with each other.

According to a further feature of the invention, semiconductor devices as described above are produced as follows. An n-conductive or p-conductive thin layer of germanium is joined with the fundamental semiconductor body, for instance, of silicon or silicon carbide by applying the germanium in the molten or fused state onto the crystalline or monocrystalline body, so that the germanium forms an alloy with the fundamental semiconductor substance. This alloy consists of mixed crystals which are doped in accordance with the doping of the germanium. The metal contact proper is then joined with the resulting coating of germanium alloy, as will be further described below.

For further description of the invention, reference is made to the four embodiments shown by way of example in respective Figs. 1 to 4 of the drawing. All illustrations are on a greatly enlarged scale and in cross-section.

Fig. 1 shows a silicon rectifier with a p-n junction. The fundamental semiconductor body consists of a silicon disk 11 of a p-type conductance. The disk is made as follows. First a rod of silicon is purified. This may be done by the known zone melting process which is preferably carried out without the use of a crucible, the silicon rod being kept in vertical position. Another applicable purifying method, involving zone drawing, is described in my copending application Serial No. 409,610, filed February 11, 1954, and assigned to the assignee of the present invention. By repeating the zone melting or zone drawing in accordance with the desired degree of purity, a single crystal of silicon of extreme degree of purity is produced which, however, in many cases is p-conductive due to otherwise hardly observable traces of impurity, for instance, of boron. The individual silicon disks are sawed from such a rod for use in the manufacture of rectifiers, transistors and other devices according to the invention. The disk 11 thus obtained, and used in the embodiment of Fig. 1, may be given a diameter of 10 mm. and a thickness of 0.4 to 0.5 mm.

Placed upon the silicon disk 11 according to Fig. 1 is a pellet of germanium which is doped by traces of antimony or arsenic so as to have pronounced n-conductance. The thickness of the germanium pellet may be 0.1 to 0.2 mm. Instead, the n-doped germanium may also be applied to the silicon disk 11 in the form of a dry powder, or in the form of a paste spread onto the silicon disk. Thereafter the silicon disk and the germanium layer are heated to cause melting of the germanium. The heating temperature should be higher than the melting point of germanium but lower than the melting point of silicon. A heating temperature of about 1100° C. is suitable. The heating is effected in vacuum or in a protective atmosphere such as hydrogen or argon for a heating period that need not exceed one-half hour. Thereafter the body is permitted to cool slowly down to room temperature. As a result of the process, the germanium forms with the adjacent portion of the silicon body an alloy layer 12 essentially of mixed crystals. As a result of the same processing, an intermediate layer 13 is produced in front of the layer 12. The intermediate 13 consists of n-conductive silicon and is caused by the entrance of defection atoms by diffusion from the layer 12 The border shown by a full line between the n-conductive layer 13 and the p-conductive fundamental body of the silicon disk 11 schematically represents the desired p-n junction within the silicon. It should be understood, however, that the thickness of the diffusion zone is shown greatly exaggerated in all illustrations. Actually it extends down to a depth of, say, 10 to 100 atoms, which corresponds to a thickness in the order of as little as one micron.

Soldered upon the alloy layer 12 is a contact or terminal 14 which may consist of any one of the known contact metals suitable for n-conductive germanium to produce a barrier-free junction. Preferably applicable are such contact metals or alloys of lead with substance from the fifth group, second subgroup, of the periodic system of elements, notably alloys of lead with phosphorus, arsenic or antimony in a proportion of about 1% P, As or Sb to about 99% Pb. In an embodiment made according to Fig. 1 and tested to have the electric properties mentioned below, a lead-antimony alloy with about 1% antimony was used.

According to Fig. 1, a connecting wire 15, preferably of a strip of copper or silver, is attached to contact 14 by soldering. A barrier-free contact 16 for instance of aluminum is fused onto the other side of the silicon disk 11. Atoms from the aluminum are likewise diffused into the silicon body 11 and have formed an intermediate layer which is more strongly doped in the sense of p-conductance. The border of this intermediate layer of higher doping, whose actual thickness is in the order of one micron, is schematically indicated by a broken line.

The aluminum contact 16 can be made as follows. Aluminum foil of 0.08 mm. thickness is placed upon the silicon disk 11 and the assembly is then heated, preferably in a protective atmosphere, to about 700° C. so as to cause the aluminum to melt. Immediately after melting occurs the assembly is permitted to slowly cool down to room temperature. After cooling, the layer 16 consists of an alloy of aluminum and silicon in the eutectic proportion of about 8% Si and about 92% Al so that aluminum is greatly preponderant. A connecting lead of copper or silver can be attached to the layer 16 with the aid of friction solder, that is tin mixed with fine chips of steel. For improving the cooling conditions the connecting lead is preferably designed as a plate 17 which offers the desired enlarged cooling surfaces.

Rectifiers as described above with reference to Fig. 1, having between the silicon disk 11 and the germanium layer 12 a junction area of about 0.5 cm.$^2$, were found suitable for a rated current of about 300 to 500 amps. for a peak inverse voltage of about 1000 volts. Such rectifiers operate satisfactorily at a temperature of about 2000° C. so that it is not difficult to apply proper cooling.

Figure 2:
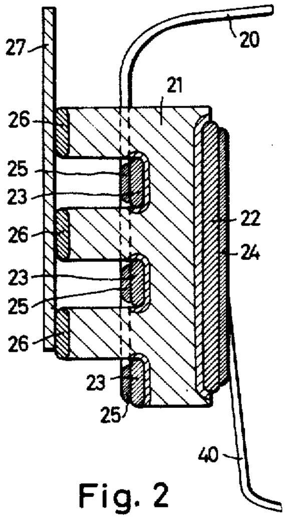

Fig. 2 shows a junction transistor corresponding to the copending application Serial No. 499,395 of Reimer Emeis, filed April 5, 1955, under the title Junction Transistors, and assigned to the assignee of the present invention. The electrodes and terminals of this junction transistor are joined with the semiconductor body in accordance with the present invention. The fundamental semiconductor body 21 consists, for instance, of p-conductive silicon. One of its broad sides is provided with a pattern of grooves or similar recesses. Of the two directional electrodes (emitter, collector) one is mounted on the broad side located opposite the pattern of grooves. The other electrode is subdivided and distributed into the grooves of the pattern. Both electrodes are produced by contact layers 22 or 23 consisting of n-conductive germanium. The germanium layer 22 is provided with a contact terminal 24 which, like the contact 14 in Fig. 1, may consist of an antimony solder (antimony alone or antimony alloy), with the aid of which the connecting lead or lug is also soldered to the electrode. The subdivided and distributed germanium layer 23 is provided with contact members 25, for instance of antimony solder, which are connected with each other by a common lead 20 that is soldered to the structure together with the contact members. A base electrode 26 of the transistor is subdivided and distributed upon the raised portions of the patterned side of the silicon disk 21. The base electrode 26 consists of aluminum contacts that are fused onto the silicon body 21 and are connected with one another by a lead or connecting plate 27 attached by soldering with the aid of friction solder.

Figure 3:
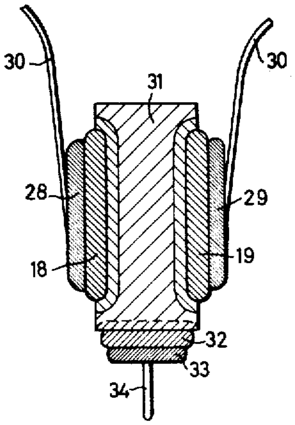

Fig. 3 shows the basic design of a p-n-p junction transistor. Disposed upon a silicon disk 31 of n-type conductance, are p-conductive germanium layers 18 and 19. The two germanium layers are located on the opposite broad sides respectively of disk 31. Due to the application of fusing temperature during the joining of the germanium layers with the silicon body, p-conductive silicon layers are formed adjacent to the germanium layers 18 and 19 to serve as directional or control electrodes (emitter, collector). The p-conductive germanium, used for contacting, may be doped for instance with additions of indium or gallium. Preferably used for the connecting contacts 28 and 29 is indium, or indium alloy with the aid of which the two connecting leads 30 of copper or silver may likewise be attached to the device. The basis electrode 32 is made of n-conductive germanium. The germanium is placed upon the periphery of the disk 31 and is provided with a terminal contact 33 of antimony solder to which the supply lead 34 is attached. Of course, a p-n-p transistor may also be given a design identical with or similar to that of the n-p-n transistor shown in Fig. 2.

Figure 4:
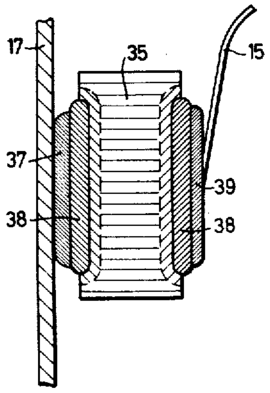

Fig. 4 shows a rectifier with a p-i-n layer sequence. The fundamental body 35 of this rectifier consists of high-ohmic silicon which is practically intrinsically conductive. Mounted on one of the broad sides of the disk is a coating 38 formed of p-conductive germanium. The coating carries an aluminum contact 37 to which the connecting plate 17 is secured. The other side of the silicon disk carries a coating 38 of n-conductive germanium. A contact 39 of an antimony solder is fused onto the germanium layer 38 and is joined with the connecting lead 15.

It will be understood by those skilled in the art upon a study of this disclosure that the embodiments and particular applications described do not exhaust the invention, but that the invention affords various other modifications and applications without departure from the essence of the invention and within the scope of the claims annexed hereto.

I claim:

1. A semiconductor device, comprising a main silicon-containing semiconductor body, means for connecting a terminal of contact metal, said means comprising a minor layer joined and alloyed with a surface portion of said body and consisting substantially of an alloy of germanium with the silicon material of said body, and a terminal of contact metal fused together with the surface of said germanium-alloy layer.

2. An electrical semiconductor device, comprising a main silicon-containing semiconductor body, means for connecting a surface member of contact metal, said means comprising a relatively thinner layer fused upon a surface zone of said body and consisting of an alloy of germanium with the silicon substance of said body, and a surface member of contact metal joined with said alloy layer and forming an electrical connection therewith, said alloy containing a trace of substitutional impurity of the same conductance type as said contact metal.

3. An asymmetrically conductive semiconductor device, comprising a silicon-containing body having conductance of a given type, a layer fused on a surface zone of said body, said layer consisting of an alloy of germanium with the silicon material of said body and having conductance of the opposite type, and a terminal member of contact metal soldered upon the surface of said alloy layer and comprising metallic substance suitable to cause in germanium said conductance of said opposite type.

4. An asymmetrically conductive semiconductor device, comprising a main silicon-containing semiconductor body having p-conductance, means for connecting a terminal member, said means comprising a relatively thinner n-conductive layer joined with a surface zone of said body and consisting of an alloy of germanium with the silicon material of said body, and a terminal member of metal fused onto said alloy layer and comprising donor metal relative to germanium.

5. An asymmetrically conductive semiconductor device, comprising a p-conductive silicon-base resistance body, a layer consisting throughout of an alloy formed of germanium with a surface zone of said body, said layer having n-type conductance, and a terminal member of metal fused onto said germanium alloy layer and consisting of antimony-containing solder.

6. An electrical semiconductor device of asymmetric conductance, comprising a main silicon-containing semiconductor body of substantially intrinsic conductance, means for connecting an electric terminal member, said means comprising a relatively thinner layer fused on a surface area of said body and consisting of an alloy formed of germanium with the silicon material of said body, and a metallic member soldered onto the surface of said germanium-alloy layer to provide an electrical terminal and comprising donor substance to make the alloy layer n-conductive.

7. An electrical semiconductor device, comprising a silicon-containing body of substantially intrinsic conductance, an n-conductive layer fused on a first surface zone of said body and consisting of an alloy of germanium with the silicon material of said body, a first metallic member comprising donor substance and being soldered upon the surface of said germanium-alloy layer to provide a first electrical terminal for said body, a layer having p-type conductance fused on a second surface zone of said body and consisting of an alloy of germanium with the silicon material of said body, and a second metallic member comprising acceptor substance and being soldered upon the surface of said second germanium-alloy layer to provide a second electrical terminal for said body.

8. The device defined in claim 7 wherein said first metallic member contains antimony, and said second metallic member contains indium.

9. A semiconductor device, comprising a silicon-base semiconductor body having conductance generally of a given type, a layer fusion-joined with an area of said body and consisting of a germanium-silicon alloy of the opposite conductance type, said body having adjacent to said layer a boundary zone likewise of said opposite conductance type whereby a p-n junction exists within said body, and contact metal fusion-joined with said alloy layer and forming a terminal.

10. A semiconductor device, comprising a main monocrystalline semiconductor body of p-type silicon, means for connecting an electric terminal member, said means comprising a relatively thinner layer fusion-joined with an area of said body and consisting of a germanium-silicon alloy of n-type conductance, said body having adjacent to said layer a boundary zone likewise of n-type conductance so as to form a p-n junction within said body, and an electric terminal of donor metal fusion-joined with said alloy layer.

11. The method of producing a silicon-base semiconductor device which comprises placing a layer of germanium onto a silicon-containing semiconductor body and heating both to germanium fusion temperature until all of the germanium forms an alloy with the silicon material of the body, and fusing a quantity of doping metal onto the alloy layer to provide an electric terminal, the germanium alloy being doped by an addition substance of the same conductance type as said doping metal.

12. The method of producing a silicon-base semiconductor device, which comprises placing n-type germanium onto a surface area of a monocrystalline silicon body of p-type conductance and heating both to germanium fusion temperature until all of the germanium forms an alloy layer with the silicon, and soldering a donor metal onto the alloy layer to form a terminal.

13. In a method of making a silicon device having rectifier action, with a p-n junction, the improvement comprising heating germanium in contact with a semiconductor body of silicon having conductance of a given type, the germanium being doped to produce conductance of another type, the heating being to a temperature higher than the melting point of germanium to melt the latter, but below the melting point of the silicon body, permitting the body to cool slowly, to form an outer relatively thinner alloy layer of mixed crystals of germanium and silicon, and to produce an intermediate layer of silicon having a conductance other than said given type, by entrance of defection atoms by diffusion from the outer layer, and affixing an electric contact terminal upon the said outer alloy to produce a barrier-free junction.

14. In a method of making a silicon device having rectifier action, with a p-n junction, the improvement comprising heating germanium in contact with a semiconductor body of p-conductive silicon, the germanium being doped to produce n-conductance, the heating being to a temperature higher than the melting point of germanium to melt the latter, but below the melting point of the silicon body, permitting the body to cool slowly, to form an outer relatively thinner alloy layer of mixed crystals of germanium and silicon, and to produce an intermediate layer of n-conductive silicon by entrance of defection atoms by diffusion from the outer layer, and soldering upon the said outer alloy an electric contact terminal to produce a barrier-free junction, said terminal comprising an alloy of lead with substance taken from the group consisting of phosphorus, arsenic, and antimony, and forming a barrier-free contact on another part of the surface of the said body of silicon.

15. In a method of making a silicon junction transistor, the improvement comprising producing collector and emitter electrodes by heating n-conductive germanium in contact with mutually spaced surface areas of a body of p-conductive silicon, the heating being to a temperature above the melting point of the germanium to melt the latter, but below the melting point of the silicon body, and then cooling the body, to form, at each of said surface areas, an outer alloy layer of mixed crystals of germanium and silicon, and to produce intermediate layers of n-conductive silicon by entrance of defection atoms by diffusion from the outer layers, and affixing a contact terminal to each of the said outer alloy layers.

16. In a method of making a silicon junction transistor, the improvement comprising producing collector and emitter electrodes by heating n-conductive germanium in contact with mutually spaced surface areas of a body of p-conductive silicon, the heating being to a temperature above the melting point of the germanium to melt the latter, but below the melting point of the silicon body, and then cooling the body, to form, at each of said surface areas, an outer alloy layer of mixed crystals of germanium and silicon, and to produce intermediate layers of n-conductive silicon by entrance of defection atoms by diffusion from the outer layers, and affixing an antimony solder contact terminal to each of the said outer alloy layers.

17. In a method of making a silicon device having rectifier action, with a p-i-n layers sequence, the improvement comprising heating germanium in contact with mutually spaced surface portions of a semiconductor body of intrinsically conductive silicon, the germanium on the respective surface portions having n- and p-conductance, the heating being to a temperature higher than the melting point of germanium to melt the latter, but below the melting point of the silicon body, cooling the body to form, at each surface portion, an outer alloy layer of mixed crystals of germanium and silicon, and to produce intermediate layers of n- and p-conductive silicon, respectively, by entrance of defection atoms by diffusion from the outer layers, placing an aluminum contact terminal upon the p-conductive one of said outer alloy layers, and forming an antimony solder contact on the n-conductive outer alloy layer.

18. In a method of making a silicon junction transistor, the improvement comprising producing collector and emitter electrodes by heating p-conductive germanium in contact with mutually spaced surface areas of a body of n-conductive silicon, the heating being to a temperature above the melting point of the germanium to melt the latter, but below the melting point of the silicon body, and then cooling the body, to form, at each surface area, an outer alloy layer of mixed crystals of germanium and silicon, and intermediate layers of p-conductive silicon by entrance of defection atoms by diffusion from the outer layers, and affixing contact terminals to said outer alloy layers.

19. In a method of making a silicon junction transistor, the improvement comprising producing collector and emitter electrodes by heating p-conductive germanium in contact with mutually spaced surface areas of a body of n-conductive silicon, the heating being to a temperature above the melting point of the germanium to melt the latter, but below the melting point of the silicon body, and then cooling the body, to form, at each surface area, an outer alloy layer of mixed crystals of germanium and silicon, and intermediate layers of p-conductive silicon by entrance of defection atoms by diffusion from the outer layers, and affixing contact terminals to said outer alloy layers, the p-conductive germanium being doped with a substance of the group consisting of indium and gallium, the said contact terminals comprising indium, connecting leads being attached to the indium contact terminals.

References Cited in the file of this patent

UNITED STATES PATENTS

| | | |
|---|---|---|
| 2,555,001 | Ohl | May 29, 1951 |
| 2,589,658 | Bardeen et al | Mar. 18, 1952 |
| 2,623,102 | Shockley | Dec. 23, 1952 |
| 2,629,672 | Sparks | Feb. 24, 1953 |

FOREIGN PATENTS

| | | |
|---|---|---|
| 510,303 | Belgium | Apr. 15, 1952 |